US012360161B2

(12) United States Patent
Srinivasan et al.

(10) Patent No.: US 12,360,161 B2
(45) Date of Patent: *Jul. 15, 2025

(54) SCAN CIRCUIT AND METHOD

(71) Applicant: STMicroelectronics International N.V., Geneva (CH)

(72) Inventors: Venkata Narayanan Srinivasan, Greater Noida (IN); Shiv Kumar Vats, Greater Noida (IN); Tripti Gupta, Ghaziabad (IN)

(73) Assignee: STMicroelectronics International N.V., Geneva (CH)

( * ) Notice: Subject to any disclaimer, the term of this patent is extended or adjusted under 35 U.S.C. 154(b) by 24 days.

This patent is subject to a terminal disclaimer.

(21) Appl. No.: 18/448,265

(22) Filed: Aug. 11, 2023

(65) Prior Publication Data
US 2024/0012051 A1    Jan. 11, 2024

Related U.S. Application Data

(63) Continuation of application No. 17/164,570, filed on Feb. 1, 2021, now Pat. No. 11,726,140.

(51) Int. Cl.
*G01R 31/3177* (2006.01)
*G01R 31/317* (2006.01)
*G06F 1/04* (2006.01)

(52) U.S. Cl.
CPC ... *G01R 31/3177* (2013.01); *G01R 31/31724* (2013.01); *G01R 31/31727* (2013.01); *G06F 1/04* (2013.01)

(58) Field of Classification Search
CPC .......... G01R 31/3177; G01R 31/31724; G01R 31/31727; G01R 31/318583;
(Continued)

(56) References Cited

U.S. PATENT DOCUMENTS 5,896,396 A     4/1999  Sanghani et al.
6,990,619 B1 *  1/2006  Kapur ............ G01R 31/318547
                                                    714/729
(Continued)

FOREIGN PATENT DOCUMENTS

CN    109444714 A       3/2019
KR    100206124 B1 *    7/1999

OTHER PUBLICATIONS

English translation of KR 100206124 B1 (Year: 1999).*
(Continued)

*Primary Examiner* — Huy Q Phan
*Assistant Examiner* — Haidong Zhang
(74) *Attorney, Agent, or Firm* — Slater Matsil, LLP

(57) ABSTRACT

In an embodiment, a method for performing scan includes: entering scan mode; receiving a test pattern; applying the test pattern through a first scan chain by asserting and deasserting a scan enable signal to respectively perform shift and capture operations to the first scan chain; while applying the test pattern through the first scan chain, controlling a further scan flip-flop with the first scan chain without transitioning a further scan enable input of the further scan flip-flop; and evaluating an output of the first scan chain to detect faults.

20 Claims, 11 Drawing Sheets

(58) Field of Classification Search
CPC .... G01R 31/318547; G01R 31/318586; G01R 31/318555; G01R 31/318544; G01R 31/318533; G06F 1/04
See application file for complete search history.

(56) References Cited

U.S. PATENT DOCUMENTS

| | | | |
|---|---|---|---|
| 7,134,061 | B2 | 11/2006 | Agashe et al. |
| 8,086,924 | B2 | 12/2011 | Forlenza et al. |
| 8,205,125 | B2 | 6/2012 | Hales et al. |
| 8,751,884 | B2 | 6/2014 | Tekumalla |
| 8,996,939 | B2 | 3/2015 | Casarsa |
| 10,591,540 | B2 | 3/2020 | Narayanan et al. |
| 10,866,280 | B2 * | 12/2020 | Narayanan ....... G01R 31/31724 |
| 11,726,140 | B2 * | 8/2023 | Srinivasan ....... G01R 31/31727 |
| | | | 324/762.01 |
| 2004/0064770 | A1 | 4/2004 | Xin |
| 2005/0060625 | A1 * | 3/2005 | Wang ............ G01R 31/318536 |
| | | | 714/727 |
| 2008/0005635 | A1 * | 1/2008 | Kaibel ........... G01R 31/318544 |
| | | | 714/731 |
| 2009/0106613 | A1 | 4/2009 | Goyal et al. |
| 2011/0099442 | A1 * | 4/2011 | Hales ............. G01R 31/318533 |
| | | | 714/E11.155 |
| 2013/0159800 | A1 | 6/2013 | Ravi et al. |
| 2013/0305106 | A1 * | 11/2013 | Mittal ............ G01R 31/318536 |
| | | | 714/E11.155 |
| 2015/0143190 | A1 | 5/2015 | McLaurin |
| 2017/0089979 | A1 | 3/2017 | Iwata et al. |
| 2017/0336472 | A1 * | 11/2017 | Tsai ................. G01R 31/31703 |

OTHER PUBLICATIONS

Borda, Parth et al., "LOC, LOS and LOES At-Speed Testing Methodologies for Automatic Test Pattern Generation Using Transition Delay Fault Model", IJRET: International Journal of Research in Engineering and Technology eISSN: 2319-1163 | pISSN: 2321-7308, vol. 3, Issue 3, Mar. 2014, pp. 273-277.

Mutschler, Ann Steffora, "Circuit Aging Becoming a Critical Consideration", SemiconductorEngineering, Deep Insights for the Tech Industry, Lower Power-High Performance, https://semiengineering.com/circuit-aging-becoming-a-critical-consideration/, Jun. 17, 2019, 12 pages.

Neerkundar, Vidya "What's the Difference Between ATPG and Logic BIST?", ElectricDesign, https://www.electronicdesign.com/technologies/test-measurement/article/21800852/whats-the-difference-between-atpg-and-logic-bist, Mar. 9, 2014, 21 pages.

Yilmaz, Mahmut, "Scan Chain Operation for Stuck-at Test, How does Scan Work", CRIBD, https://www.scribd.com/document/36803467/How-Does-Scan-Work, Sep. 2, 2010, 15 pages.

* cited by examiner

PRIOR ART
Launch-on-Capture (LOC)

Launch-on-Shift (LOS)

Pipeline LOS

SCAN CIRCUIT AND METHOD

CROSS-REFERENCE TO RELATED APPLICATIONS

This application is a continuation of application Ser. No. 17/164,570, filed on Feb. 1, 2021, which application is hereby incorporated herein by reference.

TECHNICAL FIELD

The present disclosure relates generally to an electronic system and method, and, in particular embodiments, to a scan circuit and method.

BACKGROUND

Integrated circuits (ICs) are generally tested for faults. Logic circuits are commonly tested using a method often referred to as scan testing. During scan testing, patterns are shifted in through one or more chains of flip-flops (also referred to as a scan chains) to stimulate one or more logic circuits. Results from the stimulated logic circuits are loaded into the scan chains and are shifted out for evaluation. When the shifted out patterns match expected patterns (based on proper functionality of the one or more logic circuits), then no faults are detected. When the shifted out patterns do not match the expected patterns, then faults are detected.

FIG. 1 shows exemplary launch-on-capture (LOC) waveforms of scan chain clock signal clk and scan enable signal scan_en. As shown in FIG. 1, when scan_en is in a high state, data (also referred to as test vectors, test patterns, vectors, or patterns) shifts into the scan chain each time clock signal clk pulses. When scan enable signal scan_en transitions to a low state, the first pulse of clock signal clk causes the logic circuits having inputs coupled to the scan chain to transition in a step generally referred to as launch. The second pulse of clock signal clk causes the loading of the outputs of the stimulated logic circuits into flip-flops of the scan chain. Once scan enable signal scan_en transitions to the high state, data in the scan chain shifts out each time clock signal clk pulses. The data shifted out is then evaluated for faults.

The launch and capture clock pulses may be performed at-speed so that the logic circuits are tested for faults related to transition delays.

As can be seen in FIG. 1, LOC testing allows for shifting data into or out of the scan chain at slow speed while still performing at-speed testing of the logic circuits. Thus, in some implementations, LOC testing may allow for an easier implementation of the scan circuit (compared with LOS testing) since the scan enable signal scan_en transition may be slow.

FIG. 2 shows exemplary launch-on-shift (LOS) waveforms of scan chain clock signal clk and scan enable signal scan_en. As shown, LOS testing is very similar to LOC testing. However, LOS testing performs the launch operation during the last shift pulse of clock signal clk. Thus, as shown in FIG. 2, scan enable signal scan_en transitions to the low state after the last shift pulse of clock signal clk but before the capture pulse of clock signal clk.

In a similar manner as in LOC testing, LOS testing may be performed at-speed. Thus, in some implementations, the scan enable signal scan_en implementation is designed to transition fast enough to allow for at-speed testing during LOS.

As can be seen in FIG. 2, in some implementations, LOS testing may allow for faster test time (compared with LOC testing) since LOS testing uses the clock pulse for the last shift for both shifting data through the scan chain and for the launch operation.

FIG. 3 shows exemplary pipeline LOS waveforms of scan chain clock signal clk, scan enable signal scan_en and internal scan enable signal internal_scan_en. As shown, pipeline LOS testing is a mixture of both LOC and LOS testing. For example, pipeline LOS is similar to LOC since it performs at-speed launch and capture operations with external scan enable signal "scan_en" low. Pipeline LOS is similar to LOS since it performs the launch operation during the last shift pulse of clock signal clk. However, pipeline LOS relies on internal scan enable signal "internal_scan_en" (e.g., forced high) instead of external scan enable signal "scan_en" for the capture operation, where the internal scan enable signal may be delayed (e.g., gated) based, e.g., on timing design constraints. So pipeline LOS testing may allow for faster test time (compared with LOC testing) since pipeline LOS testing uses the clock pulse with internal scan enable for the last shift for both shifting data through the scan chain and for the launch operation, and may allow for easier implementation than LOS testing since timing considerations for scan enable signal scan_en may be relaxed.

In some implementations, the internal scan enable signal internal_scan_en may transition from '1' to 'cl' on the negative edge of the launch clock pulse instead of on the positive edge of the launch clock pulse (as shown in FIG. 3).

Scan testing, e.g., with implementations as illustrated in FIGS. 1-3, may be implemented in an automated test equipment (ATE), where, e.g., the ATE provides the test vectors to the IC and evaluates the results (data shifted out) for determining faults. Scan testing may also be performed as a logic built-in-self-test (LBIST), where the IC applies the test vectors to itself (e.g., using a pseudorandom number generator) and determines whether a fault occurred by using an LBIST controller of the IC.

SUMMARY

In accordance with an embodiment, a method for performing scan includes: entering scan mode; receiving a test pattern; applying the test pattern through a first scan chain by asserting and deasserting a scan enable signal to respectively perform shift and capture operations to the first scan chain; while applying the test pattern through the first scan chain, controlling a further scan flip-flop with the first scan chain without transitioning a further scan enable input of the further scan flip-flop; and evaluating an output of the first scan chain to detect faults.

In accordance with an embodiment, an integrated circuit includes a plurality of logic circuits and a scan circuit. The integrated circuit is configured to: enter scan mode; receive a test pattern; apply the test pattern through a first scan chain of the scan circuit by asserting and deasserting a scan enable signal to respectively perform shift and capture operations to the first scan chain; and while applying the test pattern through the first scan chain, controlling a further scan flip-flop of the scan circuit with the first scan chain without transitioning a further scan enable input of the further scan flip-flop.

In accordance with an embodiment, a method for performing scan includes: entering scan mode; receiving a test pattern; selecting a sub-scan chain to become part of a first scan chain; applying the test pattern through the first scan chain by asserting and deasserting a scan enable signal to respectively perform shift and capture operations to the first scan chain; while applying the test pattern through the first scan chain, controlling an unselected sub-scan chain with the first scan chain without transitioning a scan enable input of a scan flip-flop of the unselected sub-scan chain, where the selected sub-scan chain has a length of N, the unselected sub-scan chain has a length of N, and N is a positive integer greater than or equal to 1; and evaluating an output of the first scan chain to detect faults.

In accordance with an embodiment, a method includes: entering scan mode; receiving test patterns; decompressing the test patterns; dynamically selecting scan chains from a plurality of scan chains; applying the decompressed test patterns to the selected scan chains by pulsing a clock signal and transitioning a scan enable signal coupled to the selected scan chains; and applying the decompressed test patterns to unselected scan chains without transitioning a scan enable signal coupled to the unselected scan chains; compressing outputs of the plurality of scan chains; and evaluating the compressed outputs to detect faults.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

Figure 1:
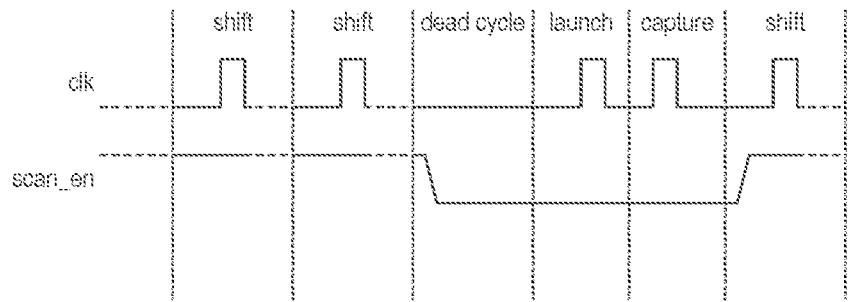
FIGS. 1-3 show exemplary launch-on-capture (LOC), launch-on-shift (LOS), and pipeline LOS waveforms, respectively.
Figure 2:
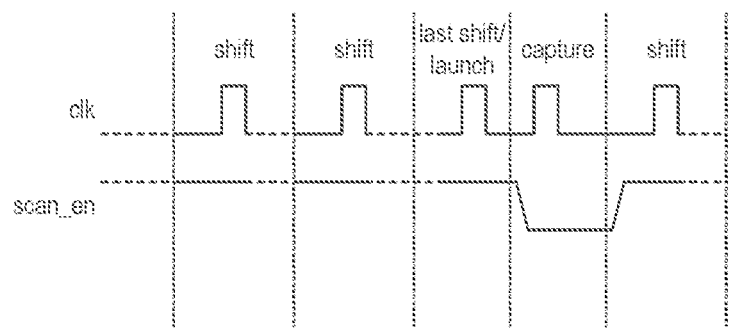
Figure 3:
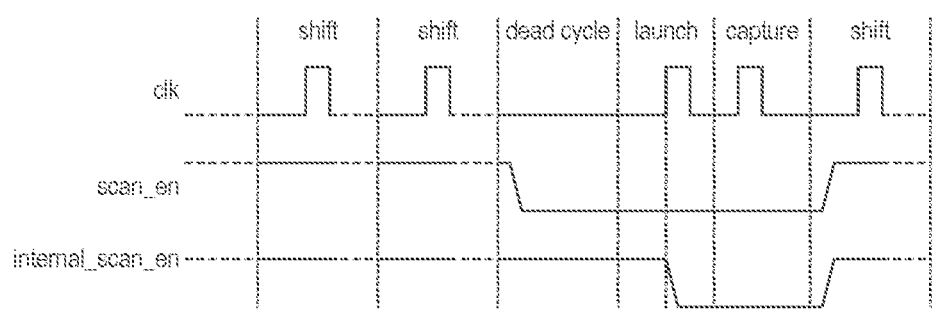

The making and using of the embodiments disclosed are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The description below illustrates the various specific details to provide an in-depth understanding of several example embodiments according to the description. The embodiments may be obtained without one or more of the specific details, or with other methods, components, materials and the like. In other cases, known structures, materials or operations are not shown or described in detail so as not to obscure the different aspects of the embodiments. References to "an embodiment" in this description indicate that a particular configuration, structure or feature described in relation to the embodiment is included in at least one embodiment. Consequently, phrases such as "in one embodiment" that may appear at different points of the present description do not necessarily refer exactly to the same embodiment. Furthermore, specific formations, structures or features may be combined in any appropriate manner in one or more embodiments.

Embodiments of the present invention will be described in a specific context, a scan circuit of an IC, a method for performing scan using LBIST or ATPG modes, and a method of modifying a scan circuit, e.g., after scan insertion. Embodiments of the present invention may be used in non-integrated circuits, such as circuits implemented in a printed circuit board (PCB). Some embodiments may be used with modes different from LBIST of ATPG and/or without modifying the scan circuit after scan insertion.

In an embodiment of the present invention, a scan circuit that includes a first scan chain provides controllability during scan to a logic circuit with an output of a further scan flip-flop that is not inside the first scan chain. The further scan flip-flop is operated without transitioning its scan enable signal (e.g., as similar to pipeline LOS mode but the further scan flip-flop SE remains '1' in both clk pulses (launch and capture) when scan_en='0'). In some embodiments, the scan flip-flop can be incorporated inside the first scan chain (e.g., based on a selection signal) without changing the length of the first scan chain by replacing a given scan flip-flop of the first scan chain. When the further scan flip-flop is incorporated in the first scan chain, the replaced given scan flip-flop is operated without transitioning its scan enable signal (e.g., as similar to pipeline LOS mode but the replaced given scan flip-flop SE remains '1' in both clk pulses (launch and capture) when scan_en='0'), e.g., to provide controllability to a logic circuit coupled to the replaced given scan flip-flop.

Scan circuits, which may include, e.g., one or more scan chains, test pattern compression and decompression circuits, and other circuits, are generally designed, e.g., to detect faults of the IC to be tested (often referred to as device under test, or DUT). In some applications, it is common practice to use automated test pattern generation (ATPG) technology to generate test patterns that maximize coverage and minimize execution time (often referred to as scan test time) while executing in a reliable and consistent manner.

In some ICs, both LBIST and ATPG may be implemented.

After scan insertion (e.g., once the scan circuit is implemented in the IC, together with other functional circuits of the IC, and timing closure has been performed), the scan circuit is generally capable of testing the IC using test patterns at a desired speed (e.g., at-speed).

It is not uncommon for changes to be performed to one or more logic circuits after scan insertion, which may be specified in an engineering change order (ECO). For example, logic circuits (which may include one or more flip-flops) may be added or modified after scan insertion, e.g., to fix design issues (often referred to as bugs), to add new functionality, or to remove features. For example, a logic circuit may be added after scan insertion for determining aging in the field.

When a logic circuit changes after scan insertion, it may not be covered by the already implemented scan circuit. The lack of coverage may be, e.g., due to no observability or no controllability. No observability may result from the changed logic circuit not providing an output to a flip-flop of the scan chain. No controllability may result from the changed logic circuit not having an input coupled to the scan chain so that the scan chain can (e.g., effectively) stimulate the changed logic circuit with the shifted data.

After a logic circuit change, the scan circuit may be modified to include additional flip-flops in the scan chain(s) to cover the changed logic circuit. Since adding new flip-flops to the scan chain(s) changes the length and/or flip-flop sequence of the scan chain(s), an LBIST controller, scan compressor and decompressor, and/or ATPG may be regenerated.

In some IC design flows, the scan circuit may be designed with additional dummy flip-flops in the scan chains so that they can be used in the event of a logic circuit change after scan insertion. In the event of a logic circuit change after scan insertion, the dummy flip-flops are rerouted so that the provide coverage to the changed logic circuit. But adding dummy flip-flops may unnecessarily increase the scan chain length if there is no logic circuit change after scan insertion. If there are not enough dummy flip-flops to accommodate for the logic circuit change after scan insertion, new scan flip-flops may need to be added to the scan chain(s) to provide scan coverage to the changed logic circuit, which may change the length and/or flip-flop sequence of the scan chain(s), an LBIST controller, scan compressor and decompressor, and/or cause ATPG to be regenerated.

In an embodiment of the present invention, a scan flip-flop that is not in a scan chain is controlled by the scan chain when in scan mode. The scan enable input terminal of the scan flip-flop that is not in the scan chain is kept asserted so that the scan flip-flop that is not in the scan chain operates in shift mode during scan. In some embodiments, the scan enable input terminal of the scan flip-flop that is not in the scan chain does not toggle during scan mode.

Advantages of some embodiments include the ability to control, during scan, a logic circuit that is not directly controlled by a scan flip-flop of a scan chain by using another scan flip-flop that is not in the scan chain, thereby advantageously allowing controllability of the logic circuit without interfering with the operation of the scan chain. Thus, some embodiments advantageously allow controllability of, e.g., a logic circuit added after scan insertion without adding scan flip-flops to the scan chain and, in some embodiments, without using dummy scan flip-flops of the scan chain.

Figure 4:
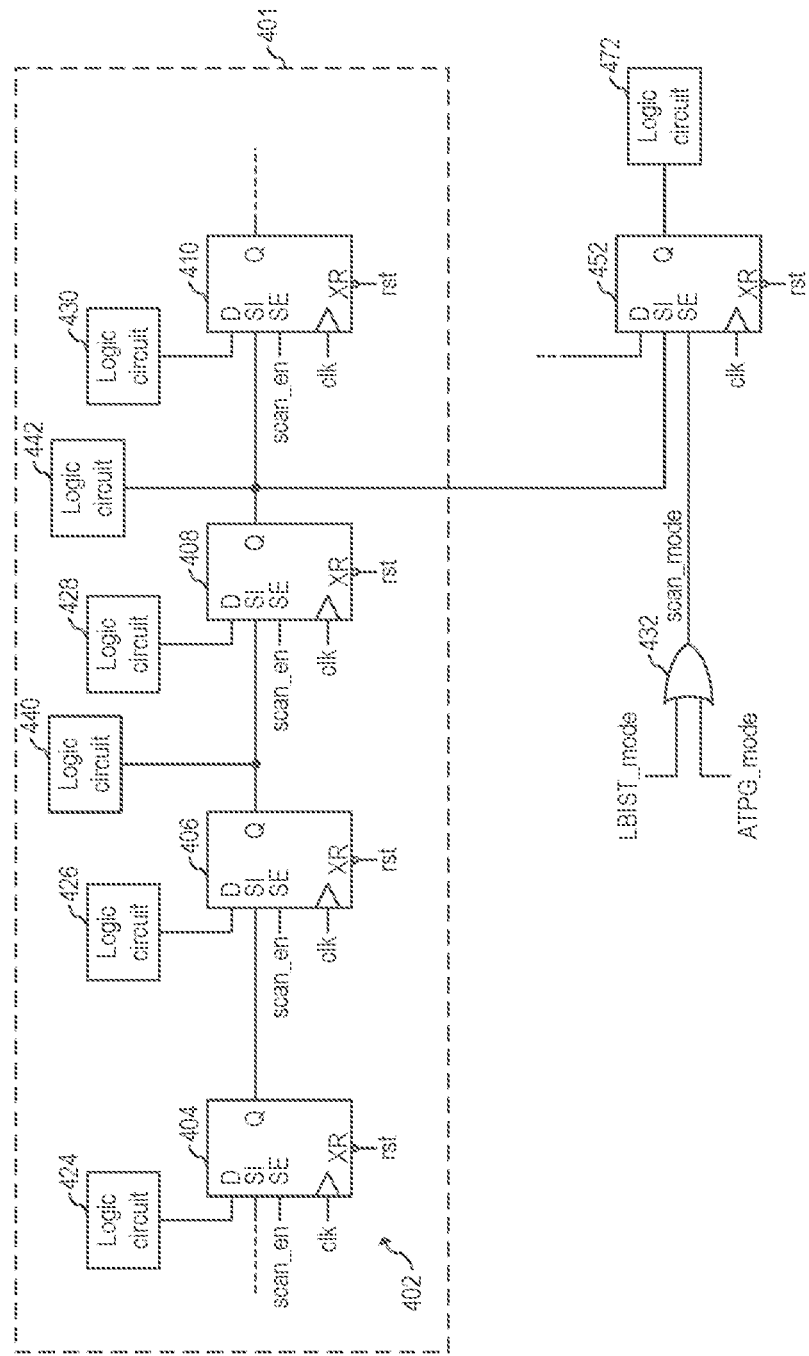
FIGS. 4, 5, and 6A show portions of scan circuits, according to embodiments of the present invention.

FIG. 4 shows a portion of scan circuit 400, according to an embodiment of the present invention. Scan circuit 400 includes scan chain 402, which includes scan flip-flops 404, 406, 408, and 410 for testing logic circuits 424, 426, 428, and 430. Scan circuit 400 also includes scan flip-flop 452 for controlling logic circuit 472. It is understood that scan chain 402 may include additional scan flip-flops (not shown).

In some embodiments, scan chain 402 may operate in LOC mode. For example, when scan enable signal scan_en is asserted (e.g., high), scan flip-flops 404, 406, 408, and 410, perform a shift operation by outputting at their respective Q output data at their respective SI input during each pulse of clock signal clk. When scan enable signal scan_en deasserts (e.g., low), data at the respective D inputs of each scan flip-flops 404, 406, 408, and 410 is outputted at their respective Q output during a pulse of clock signal clk. Thus, when scan enable signal scan_en is deasserted, outputs from logic circuits 424, 426, 428, and 430 are captured in the scan flip flops 404, 406, 408, and 410. After capture, scan enable signal scan_en is asserted, thus causing a shift in scan chain 402 each pulse of clock signal clk.

Scan flip-flops of scan chain 402 may stimulate one or more logic circuits. As an example, logic circuits 440 and 442 are stimulated by outputs of scan flip-flops 406 and 408, respectively. Other logic circuits may be coupled to outputs of one or more scan flip-flops of scan chain 402. In some embodiments, some scan flip-flops may not have a logic circuit coupled to its output.

It is understood that logic circuits 424, 426, 428, and 430, may be stimulated (e.g., during the launch operation) by, e.g., other circuits, such as other scan chain flip-flops (not shown) of scan chain 402, or another scan chain. It is also understood that one or more of scan flip-flops 404, 406, 408, and 410 may have its output Q coupled to one or more logic circuits (not shown).

In some embodiments, scan chain 402 may operate in LOS mode or pipeline mode without affecting the controllability of scan flip-flop 452 (e.g., with the SE input of scan flip-flop 452 remaining high).

Scan circuit 400 may be used to provide scan controllability to a logic circuit (e.g., 472) by using a scan flip-flop (e.g., 452) that is not inside scan chain 402. For example, in the embodiment of FIG. 4, logic circuit 472 may be controlled during scan by an output of scan flip-flop 472, which is not inside scan chain 402. In some embodiments, one or more outputs of logic circuit 472 are observable during scan by being coupled to inputs of scan flip-flops of scan chain 402 and/or other scan chains (not shown).

In some embodiments, controllability of flip-flop 452 may be as follows. During scan mode (e.g., in LBIST mode or ATPG_mode), the output of OR gate 432 is kept high. For example, signal LBIST_mode may be received from a register bit that is high during LBIST mode. Similarly, signal ATPG_mode may be received from a register bit that is high during ATPG mode.

Since the output of OR gate 432 is kept high during scan (e.g., regardless of whether scan enable signal scan_en is high or low), the output of scan flip-flop 408 (which is coupled to the SI input of scan flip-flop 452) is outputted at the Q output of scan flip-flop 452 each pulse of clock signal clk, thereby stimulating logic circuit 472 (which may have its output captured using, e.g., LOC, LOS, or pipeline LOS by, e.g., another scan flip-flop).

As can be seen in FIG. 4, in some embodiments, by keeping the SE input of scan flip-flop 452 high during scan mode, scan chain 402 provides controllability to scan flip-flop 452 in a mode similar to pipeline LOS mode without having an SE input transition in launch and also in capture clk pulse. Thus, some embodiments advantageously use shorter test patterns (because of the extended pipeline LOS controllability) without the challenges associated with SE transitioning during LOS mode and pipeline LOS mode, such as timing challenges associated with a fast SE transition.

In some embodiments, scan flip-flop 452 and/or logic circuit 472 may advantageously be added after scan insertion without modifying scan chain 402 (e.g., without increasing/decreasing the length of scan chain 402 or otherwise modifying scan chain 402 in a way that would affect the shift/launch/capture operation of scan chain 402). Thus, in some embodiments, logic circuit 472 may be advantageously controlled (e.g., stimulated) during scan by scan chain 402 without modifying scan chain 402.

Logic circuits 424, 426, 428, and 430 may be portions of the same or different logic circuits of the IC.

Scan flip-flops 404, 406, 408, 410, and 452 have D, SI, SE, CLK, and XR inputs and a Q output. In the embodiment shown in FIG. 4, the scan flip flops are configured to output at Q the value at D when CLK pulses and input SE is low. The scan flip flops 404, 406, 408, 410, and 452 are configured to output at Q the value at SI when CLK pulses and input SE is high. The output at Q is cleared (e.g., set to low) when input XR is asserted (e.g., low). Scan flip-flops 404, 406, 408, 410, and 452 may be implemented in other ways known in the art.

In some embodiments, the output of logic circuit 472 may be coupled (e.g., directly connected) to a dummy scan flip-flop of scan chain 402. In some embodiments, the output of logic circuit 472 may be coupled (e.g., directly connected) to a dummy scan flip-flop of a scan chain different than scan chain 402.

In some embodiments, the frequency of clock signal elk may be, e.g., 500 MHz. Faster frequencies, such as 550 MHz, 800 MHz, or faster, or slower frequencies, such as 450 MHz, 200 MHz, or slower, may also be used. In some embodiments, the frequency of clock signal clk when running at-speed may be based on the functional specification (e.g., datasheet) of the IC.

In an embodiment of the present invention, a scan chain is configurable to select a scan flip-flop from a plurality of scan flip-flops to be inside the scan chain. In some embodiments, an unselected scan flip-flop of the plurality of scan flip-flops, although not inside the scan chain, may receive an input from the scan chain, e.g., to control a logic circuit during scan, e.g., in a mode similar to pipeline LOS mode without having an SE input transition in launch and also in capture clk pulse.

Figure 5:
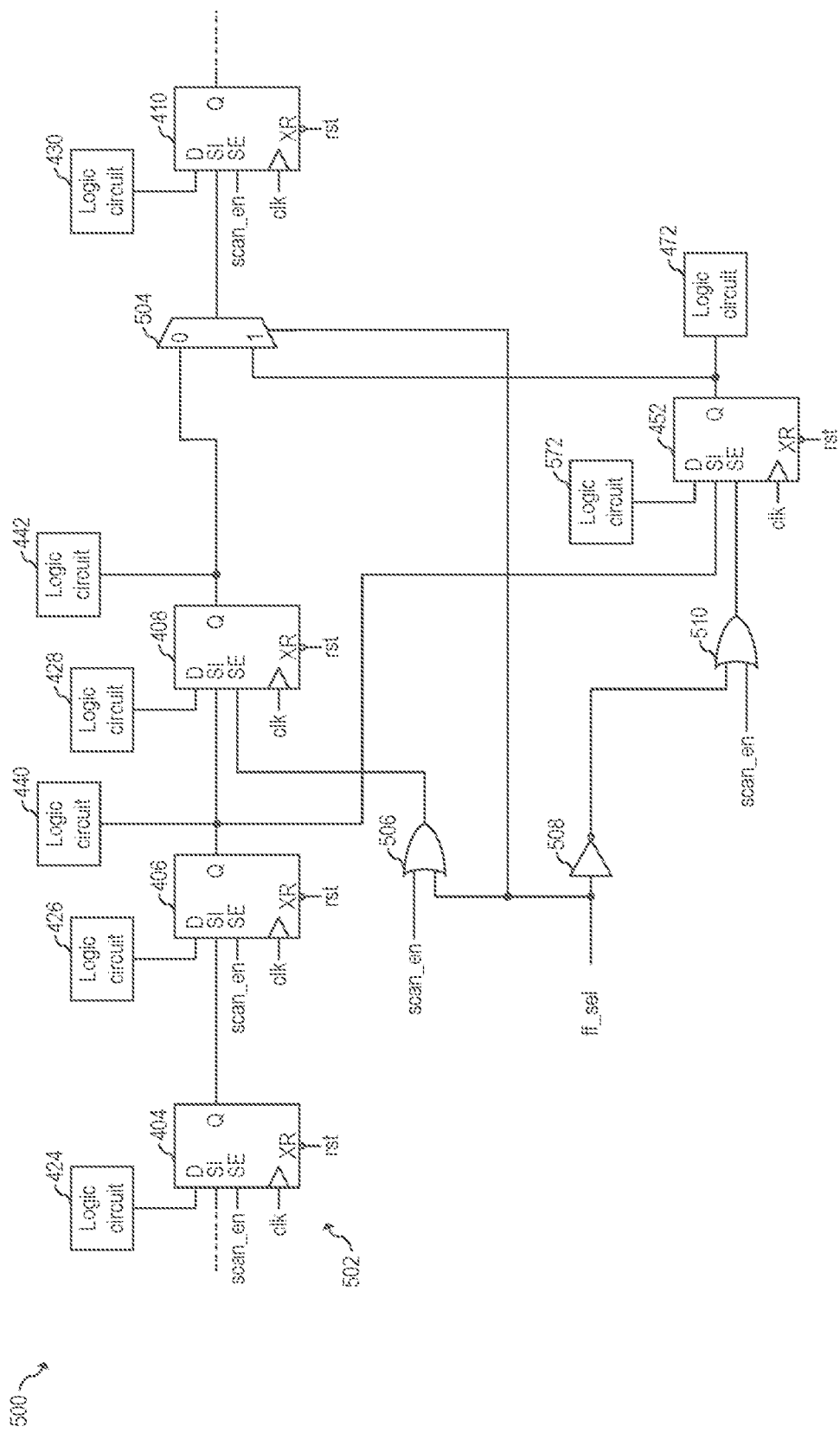

FIG. 5 shows a portion of scan circuit 500, according to an embodiment of the present invention. Scan circuit 500 includes scan chain 502, which includes scan flip-flops 404, 406, and 410 for testing logic circuits 424, 426, 428, and 430. Scan circuit 500 also includes scan flip-flop 452 for controlling logic circuit 472 and for observing an output of logic circuit 572. As will be described in more details later, scan chain 502 also includes either scan flip-flop 408 or scan flip-flop 452.

During scan, signal ff_sel selects either scan flip-flop 408 or scan-flip-flop 452 to be inside scan chain 502. For example, when signal ff_sel is low, scan enable signal scan_en controls the SE input of scan flip-flop 408 and MUX 504 couples the Q output of scan flip-flop 408 with the SI input of scan flip-flop 410. Since signal ff_sel is coupled to the SE input of scan flip-flop 452 via inverter 508 and OR gate 510, the input SE of scan flip-flop 452 remains high when signal ff_sel is low. Thus, when signal ff_sel is low, scan circuit 500 operates in a similar manner as scan circuit 400 (e.g., with the difference that scan flip-flop 406 provides controllability to scan flip-flop 452 instead of scan flip-flop 408), thereby providing controllability to scan flip-flop 452 (which stimulates logic circuit 472) in a mode similar to pipeline LOS mode without having an SE input transition in launch and also in capture clk pulse, and providing observability to logic circuit 428 (via scan flip-flop 408 and MUX 504).

When signal ff_sel is high, scan enable signal scan_en controls the SE input of scan flip-flop 452, MUX 504 couples the Q output of scan flip-flop 452 with the SI input of scan flip-flop 410, and the input SE of scan flip-flop 408 remains high. Thus, when signal ff_sel is high, scan circuit 500 provides controllability to scan flip-flop 408 (which stimulates logic circuit 442) in a mode similar to pipeline LOS mode without having an SE input transition in launch and also in capture clk pulse, and provides observability to logic circuit 572 (via scan flip-flop 452 and MUX 504).

In some embodiments, the outputs of OR gates 506 and 510 may be gated (e.g., using respective AND gates) based on a scan mode signal scan mode indicative of whether the IC is in scan mode.

As illustrated, e.g., by FIG. 5, some embodiments advantageously allow for providing scan observability and controllability to logic circuits that may be added or modified after scan insertion without changing the length of the scan chain. For example, in an embodiment, logic circuits 472 and 572, and scan flip-flop 452 may be added after scan insertion.

In some embodiments, a first set of test vectors may be run through scan chain 502 with signal ff_sel low, to, e.g., provide observability to logic circuit 428 and controllability to logic circuits 442 and 472, and a second set of test vectors may be run through scan chain 502 with signal ff_sel high, to, e.g., provide observability to logic circuit 572 and controllability to logic circuits 442 and 472. Thus, in some embodiments, signal ff_sel may be static while running a set of test patterns.

In the embodiment of FIG. 5, scan flip-flop 408 is shown to be between two scan flip flops. For example, when scan flip-flop 408 is selected to be in scan chain 502 (when signal ff_sel is low) scan flip-flop 408 receives its SI input from another scan flip-flop of scan chain 502 (scan flip-flop 406) and provides its Q output to another scan flip flop of scan chain 502 (scan flip-flop 410). In some embodiments, scan flip-flop 408 may be implemented as the first scan flip-flop of scan chain 502 (e.g., receiving its SI input directly from an LBIST controller or from an ATE). In some embodiments, scan flip-flop 408 may be implemented as the last scan flip-flop of scan chain 502 (e.g., providing its Q output directly to the LBIST controller or to the ATE).

Figure 6A:
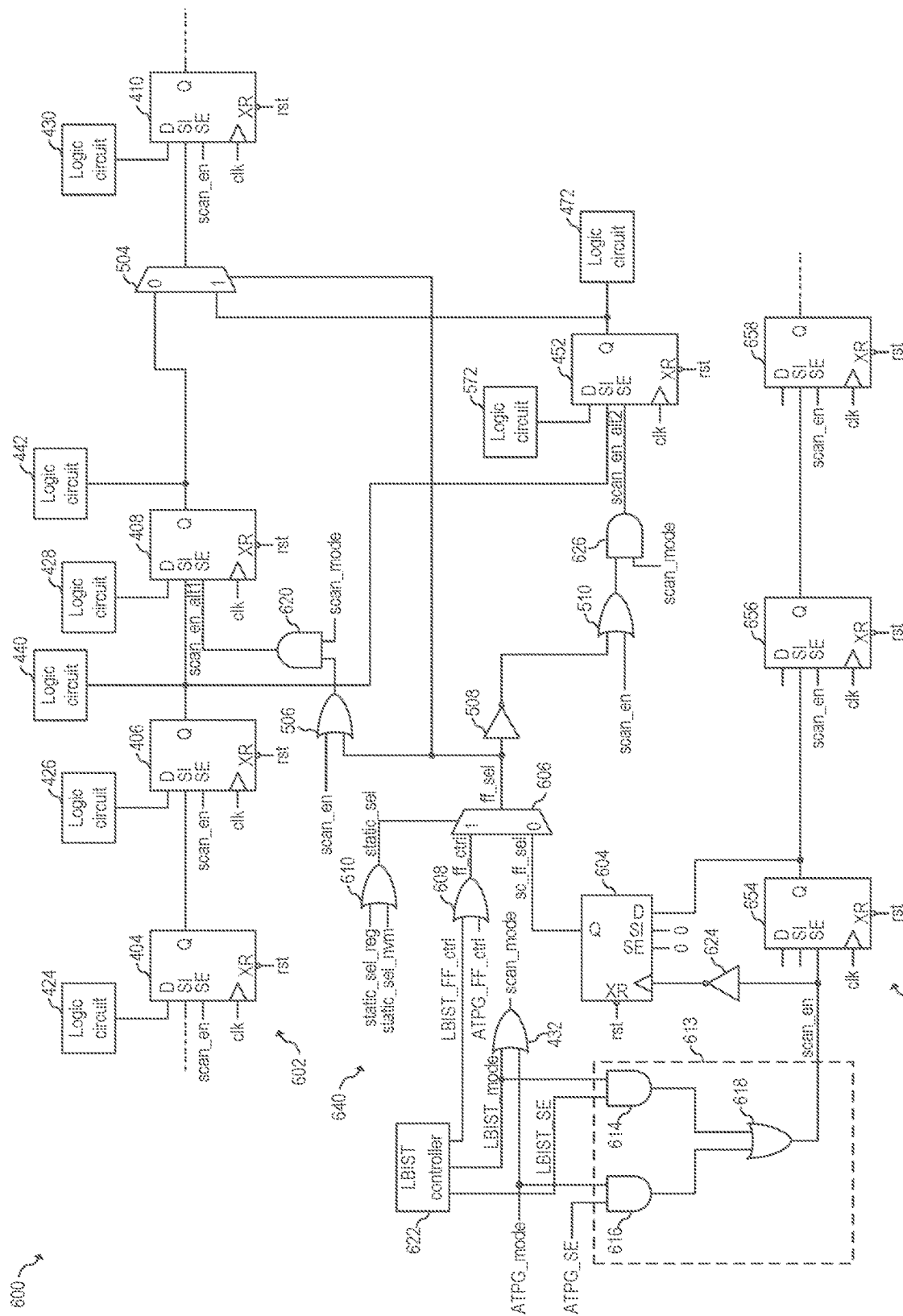

In some embodiments, the scan chain is configured to dynamically select which scan flip-flop is inside the scan chain, e.g., based on a test pattern. For example, FIG. 6A shows a portion of scan circuit 600, according to an embodiment of the present invention. Scan circuit 600 includes scan chain 602, which includes scan flip-flops 404, 406, and 410 and ether scan flip-flop 408 or 452. Scan circuit 600 also includes scan chain 652. As will be described in more detail later, scan chain 652 may be a scan chain that receives test patterns that are not compressed using test pattern compression techniques.

In the embodiment of FIG. 6A, during scan (when signal scan mode is high), if signal static_sel is high, then scan circuit 600 operates in a similar manner as scan circuit 500. For example, as illustrated in FIG. 6A, when signal static_sel is high, signal ff_sel may be controlled based on signal LBIST_FF_ctrl or signal ATPF_FF_ctrl, e.g., via OR gate 608.

If signal static_sel is low, then signal ff_sel is controlled by scan chain 652. For example, when signal static_sel is low, signal ff_sel is equal to signal sc_ff_sel. Signal sc_ff_sel is latched based on scan enable signal scan_en and has a value based on the output of scan flip-flop 654. When the value of signal sc_ff_sel is high, then the value of signal ff_sel is high and scan circuit 600 provides observability to logic circuit 572 and controllability to logic circuits 442 and 472 (e.g., in a similar manner as described with respect to FIG. 5). When the value of signal sc_ff_sel is low, then the value of signal ff_sel is low and scan circuit 600 provides observability to logic circuit 428 and controllability to logic circuits 442 and 472 (e.g., in a similar manner as described with respect to FIG. 5).

As illustrated in FIG. 6A, some embodiments advantageously allow for dynamic selection of which scan flip-flop is inside a scan chain (e.g., scan chain 602) during execution of a test pattern and based on an output from a scan flip-flop of another scan chain (e.g., scan chain 652).

In some embodiments, signals LBIST_FF_ctrl and signal ATPF_FF_ctrl are based on respective register bits. In some embodiments, signal LBIST_FF_ctrl is generated by LBIST controller 622. In some embodiments, signal ATPF_FF_ctrl is generated externally to scan circuit 600, such as by an ATE or from a register bit.

In some embodiments, signal static_sel may be based on either a register bit (e.g., static_sel_reg) or a bit stored in non-volatile memory (e.g., static_sel_nvm).

In some embodiments, the signal scan mode, which is indicative of whether the IC that includes scan circuit 600 is in scan mode, is generated based on signal LBIST_mode (which is indicative of whether scan circuit 600 is in LBIST mode), or signal ATPG_mode (which is indicative of whether scan circuit 600 is in ATPG mode). In some embodiments, signals LBIST_mode and ATPG_mode are based on respective register bits.

In some embodiments, scan enable signal scan_en is generated based on signal ATPG_SE (which is a scan enable signal associated with ATPG test patterns), signal LBIST SE (which is a scan enable signal associated with LBIST test patterns), and signals ATPG_mode and LBIST_mode.

In some embodiments, LBIST controller 622 is part of scan circuit 600 and is configured to generate test patterns for testing the logic circuit of the IC (e.g., logic circuits 424, 426, 428, 430). In some embodiments, LBIST controller 622 generates the test patterns using a random number generator. LBIST controller 622 may be implemented in any way known in the aft. A same or similar LBIST controller may be included in other scan circuits (e.g., scan circuits 400 or 500).

In some embodiments, scan flip-flop 654 is configured to control the state of signal ff_sel. Scan flip-flop 654 may be the first scan flip-flop of scan chain 652, the last scan flip-flop of scan chain 652, or a scan flip-flop coupled between the first and last scan flip-flops of scan chain 652.

Figure 6B:
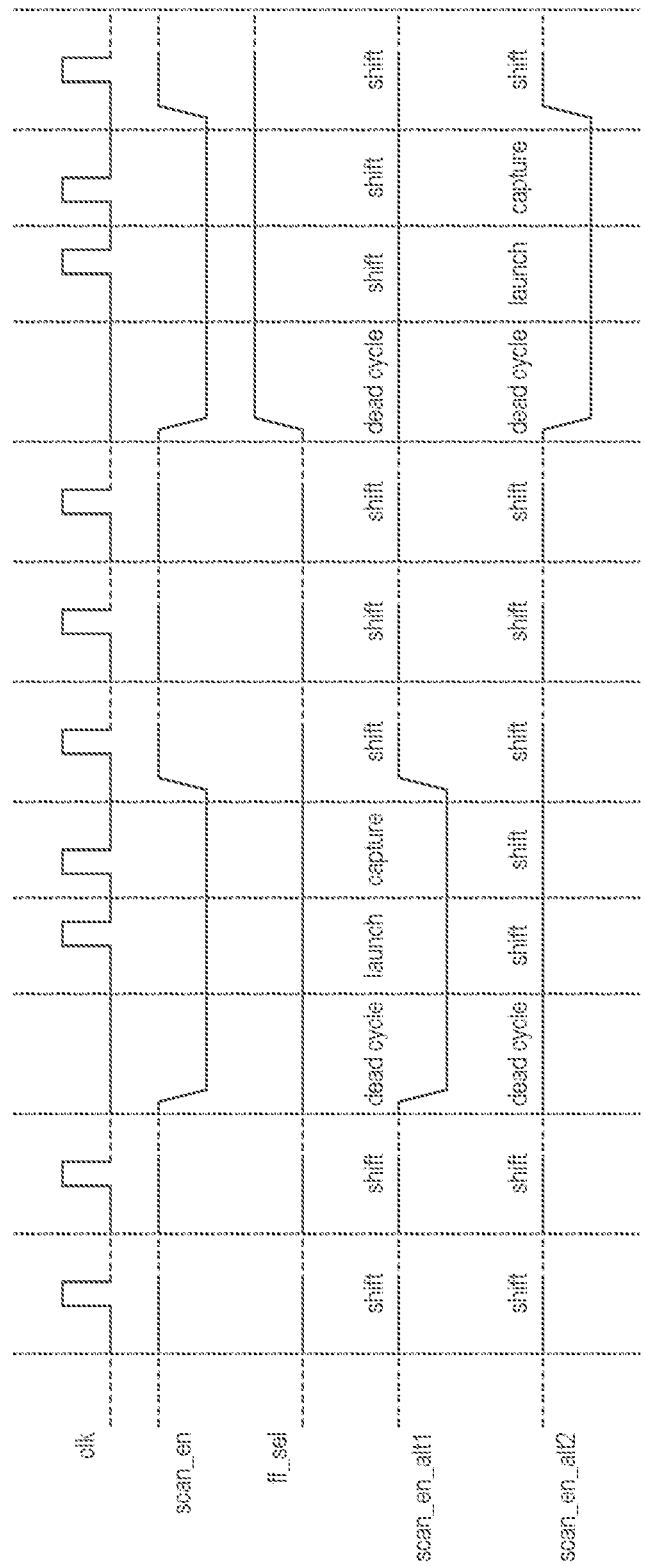
FIG. 6B shows waveforms generated by the scan circuit of FIG. 6, according to an embodiment of the present invention.

FIG. 6B shows waveforms of scan circuit 600, according to an embodiment of the present invention. As shown in FIG. 6B, when signal ff_sel is low, scan_en_alt1 is, e.g., identical to scan enable signal scan_en while signal scan_en_alt2 is kept high. When signal ff_sel is high, scan_en_alt2 is, e.g., identical to scan enable signal scan_en while signal scan_en_alt1 is kept high. Thus, in some embodiments, one of the alternative scan flip-flops (e.g., 408/452) operates, e.g., in LOC mode while the other of the alternative scan flip-flops (e.g., 452/408) shifts during each pulse of clock signal clk regardless of the state of scan enable signal scan_en.

Figure 7:
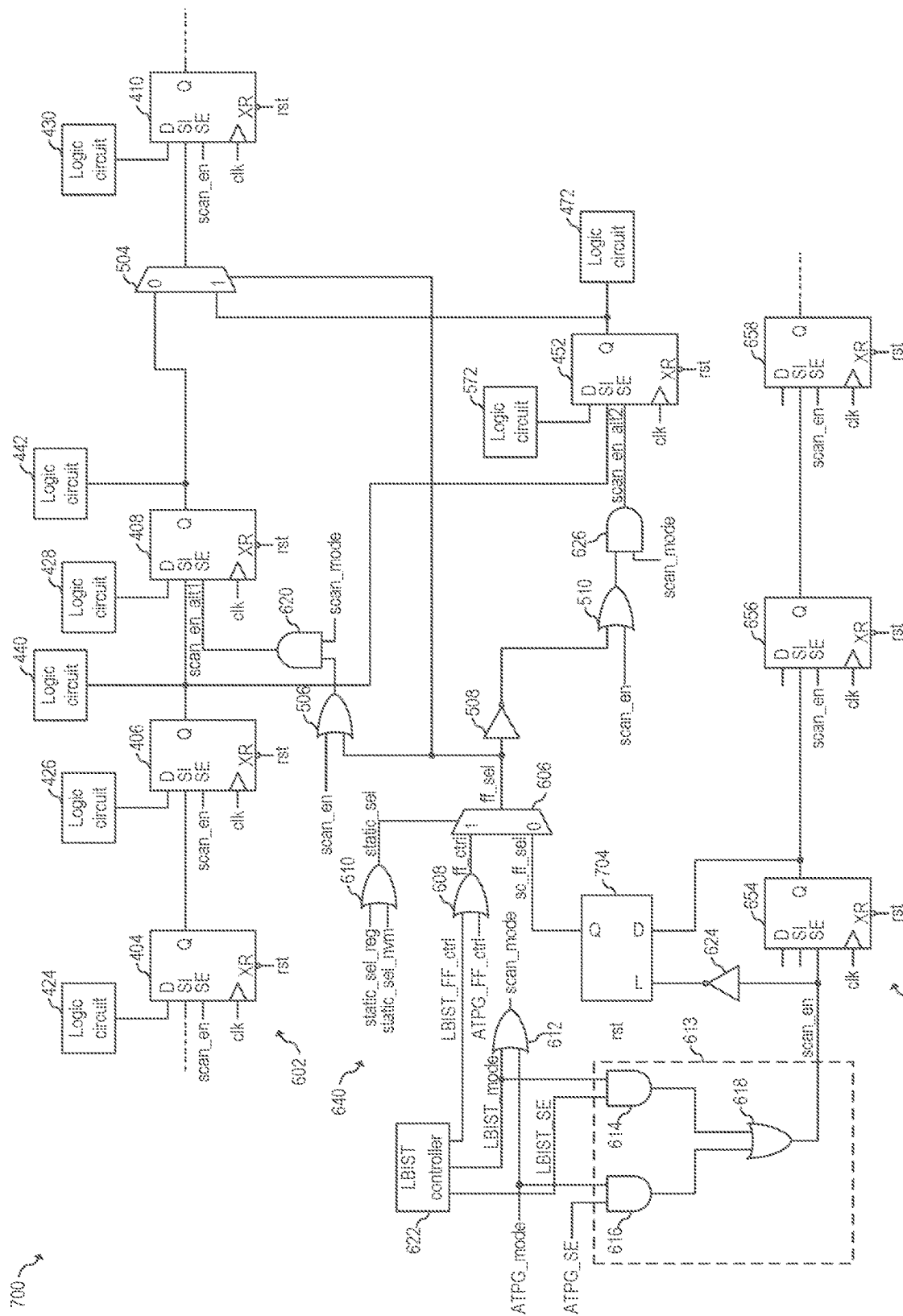
FIGS. 7-11 show portions of scan circuits, according to embodiments of the present invention.

Scan circuit 600 is a possible implementation for dynamically selecting which scan flip-flop is inside a scan chain (e.g., scan chain 602) during execution of a test pattern and based on an output from a scan flip-flop of another scan chain (e.g., scan chain 652). Other implementations are also possible. For example, FIG. 7 shows a portion of scan circuit 700, according to an embodiment of the present invention. Scan circuit 700 is similar and may operate in a similar manner as scan circuit 600. In some embodiments, scan circuit 700 may generate waveforms similar or identical to the waveforms shown in FIG. 6B. Scan circuit 700, however, includes latch 704 instead of scan flip-flop 604.

Latch 704 is configured to latch the value of its D input, and output such value at its Q output when its L input transitions from high to low. Latch 704 may be implemented in any way known in the art.

Figure 8:
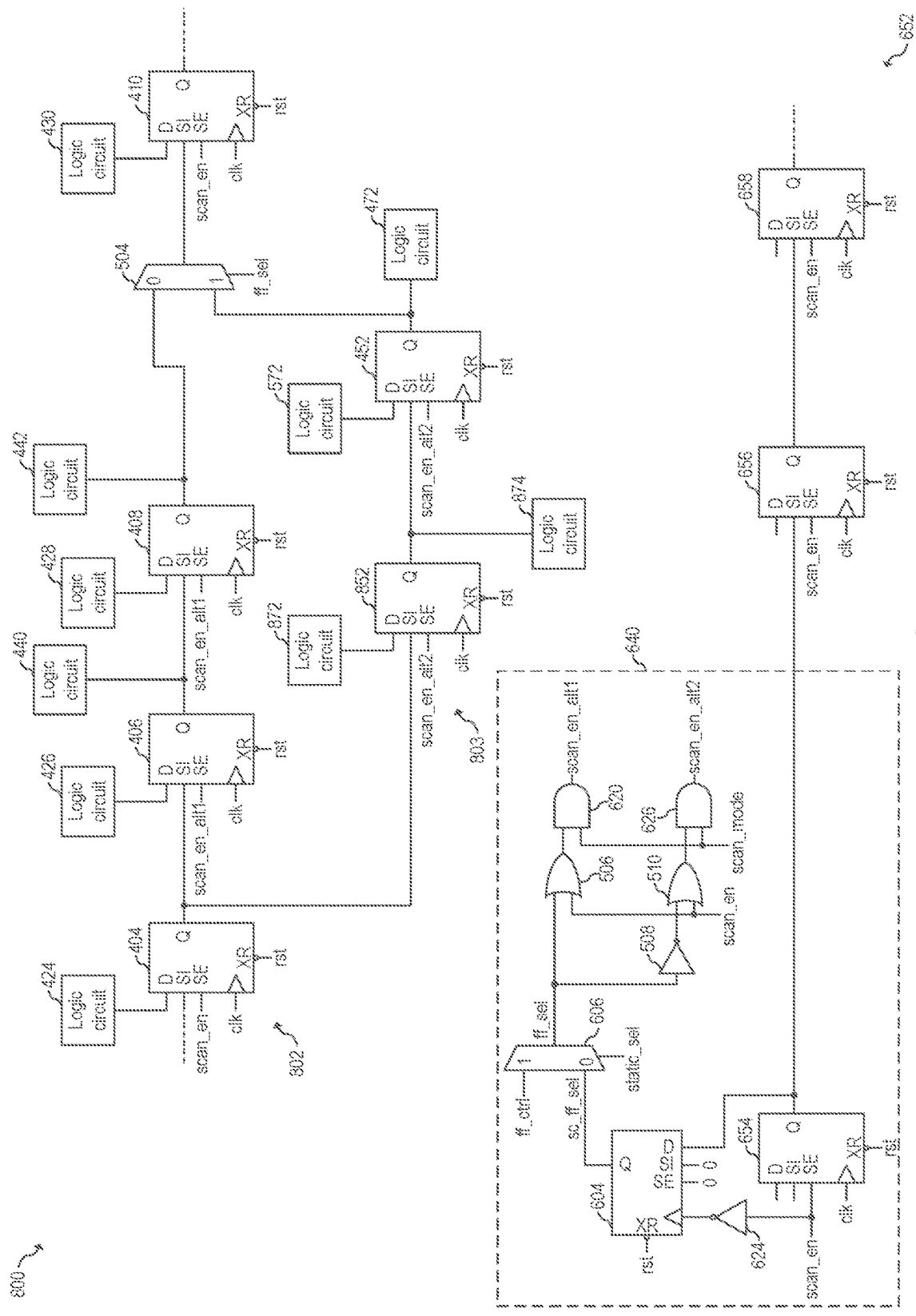

In some embodiments, more than one scan flip-flop may be (statically or dynamically) selectable to be part of a scan chain while the other provides controllability to one or more logic circuits in a mode similar to pipeline LOS mode without having an SE input transition in launch and also in capture clk pulse. For example, FIG. 8 shows a portion of scan circuit 800, according to an embodiment of the present invention. Scan circuit 800 is similar and operates in a similar manner as scan circuit 600. Scan circuit 800, however, has two scan flip-flops that are selectable to be part of scan chain 802. For example, when signal ff_sel is low, scan flip-flops 406 and 408 provide observability to logic circuits 426 and 428, respectively, and provide controllability to logic circuits 440 and 442, respectively, while scan flip-flops 852 and 452 provide controllability to logic circuits 874 and 472, respectively, in a mode similar to pipeline LOS mode without having an SE input transition in launch and also in capture clk pulse. When signal ff_sel is high, scan flip-flops 852 and 452 provide observability to logic circuits 872 and 572, respectively, and provide controllability to logic circuits 874 and 472, respectively, while scan flip-flops 406 and 408 provide controllability to logic circuits 440 and 442, respectively, in a mode similar to pipeline LOS mode without having an SE input transition in launch and also in capture clk pulse.

As shown in FIG. 8, and in a similar manner as shown in FIGS. 6A and 6B, signals ff_sel, scan_en_alt1, and scan_en_alt2 may be generated by circuit 640. In some embodiments, scan circuit 800 may be implemented with circuit 740 instead of circuit 640 (in which latch 704 is used instead of scan flip-flop 604). Other implementations are also possible.

As shown in FIG. 8, alternatively selectable scan flip-flops 852 and 452 may be understood as being part of alternative scan chain 803, which is alternatively selectable to replace a portion of scan chain 802 of similar length (the same number of scan flip-flops, in this example 2 scan flip-flops) based on signal ff_sel. In some embodiments, alternative scan chain 803 may have more than two scan flip-flops. For example, in some embodiments, alternative scan chain 803 has L scan flip-flops that are alternatively selectable to replace L scan flip-flops of scan chain 802 based on signal ff_sel, where L is a positive integer greater than or equal to 1, such as 2, 3, 4, 10, 50, 100, or higher.

Figure 9:
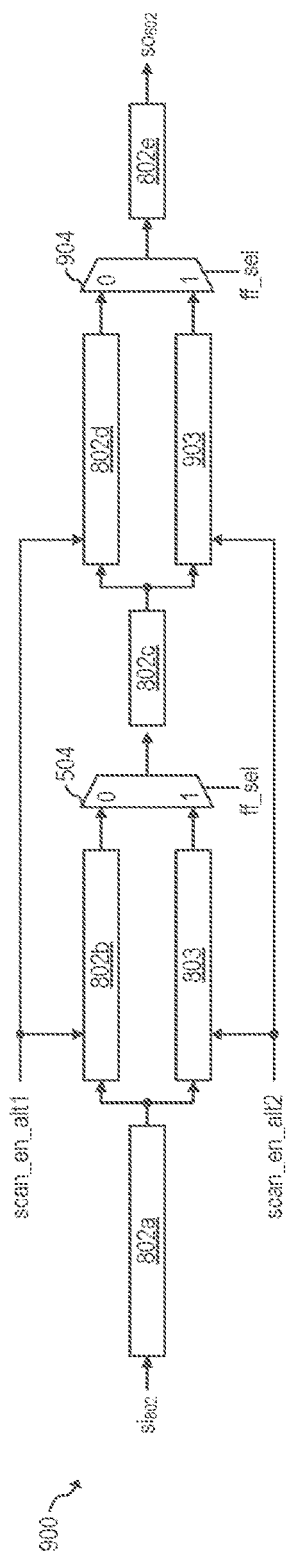

In some embodiments, a scan chain may have more than one separate portions that are alternatively selectable based on signal ff_sel. For example, FIG. 9 shows a portion of scan circuit 900, according to an embodiment of the present invention. Scan circuit 900 includes scan chain 802, which has five portions (802a, 802b, 802c, 802d, and 802e).

During scan mode, scan chain 802 receives test patterns at its input ($si_{802}$) and produces outputs at its output ($so_{802}$). When signal ff_sel is low, scan chain 802 operates in a similar manner as described with respect to FIG. 8 when signal ff_sel is low. When signal ff_sel is high, alternatively selectable scan chains 803 and 903 replace portions 802b and 802d of scan chain 802, respectively, so that portions 802b and 802d are controllable in a mode similar to pipeline LOS mode without having an SE input transition in launch and also in capture clk pulse.

As shown in FIG. 9, MUXes 504 and 904 are controlled by signal ff_sel, portions 802b and 802d receive the same signal scan_en_alt1 (e.g., for scan enable of the scan flip-flops of portions 802b and 802d), and scan chains 803 and 903 receive the same signal scan_en_alt2 (e.g., for scan enable of the scan flip-flops of portions scan chains 803 and 903). In some embodiments, signals ff_sel, scan_en_alt1, and scan_en_alt2 may be generated, e.g., as shown in FIG. 8. Other implementations are also possible. For example, in some embodiments, MUX 504, portion 802b, and scan chain 803 may receive a first set of signals (e.g., signals ff_sel$_1$, scan_en_alt1$_1$, and scan_en_alt2$_1$, respectively), and MUX 904, portion 802d, and scan chain 903 may receive a second set of signals (e.g., signals ff_sel$_2$, scan_en_alt1$_2$, and scan_en_alt2$_2$, respectively), where the first and second sets of signals are generated based on different scan flip-flops. For example, in some embodiments, the first set of signal may be based on scan flip-flop 654 while the second set of signals may be based on another scan flip-flop, which may be another scan-flip flop of scan chain 652 or of another scan chain.

In some embodiments, alternative scan chains 803 and 903 have the same length. For example, in some embodiments, both scan chains 803 and 903 have one scan flip-flops). In other embodiments, scan chains 803 and 903 may both have more than 1 scan flip-flop, such as 2, 3, 10, or more).

In some embodiments, alternative scan chains 803 and 903 have different lengths. For example, in some embodiments, scan chain 803 has 2 scan flip-flops while scan chain 903 has three scan flip-flops. A different number of scan flip-flops for scan chains 803 and 903 is also possible.

Although FIG. 9 illustrates two alternative scan chains (803 and 903), more than two alternative scan chains may be used in the same scan chain (802).

It is understood that scan circuits 400, 500, 600, 700, 800, and 900 may be adapted to operate with a different polarity of the signals.

Figure 10:
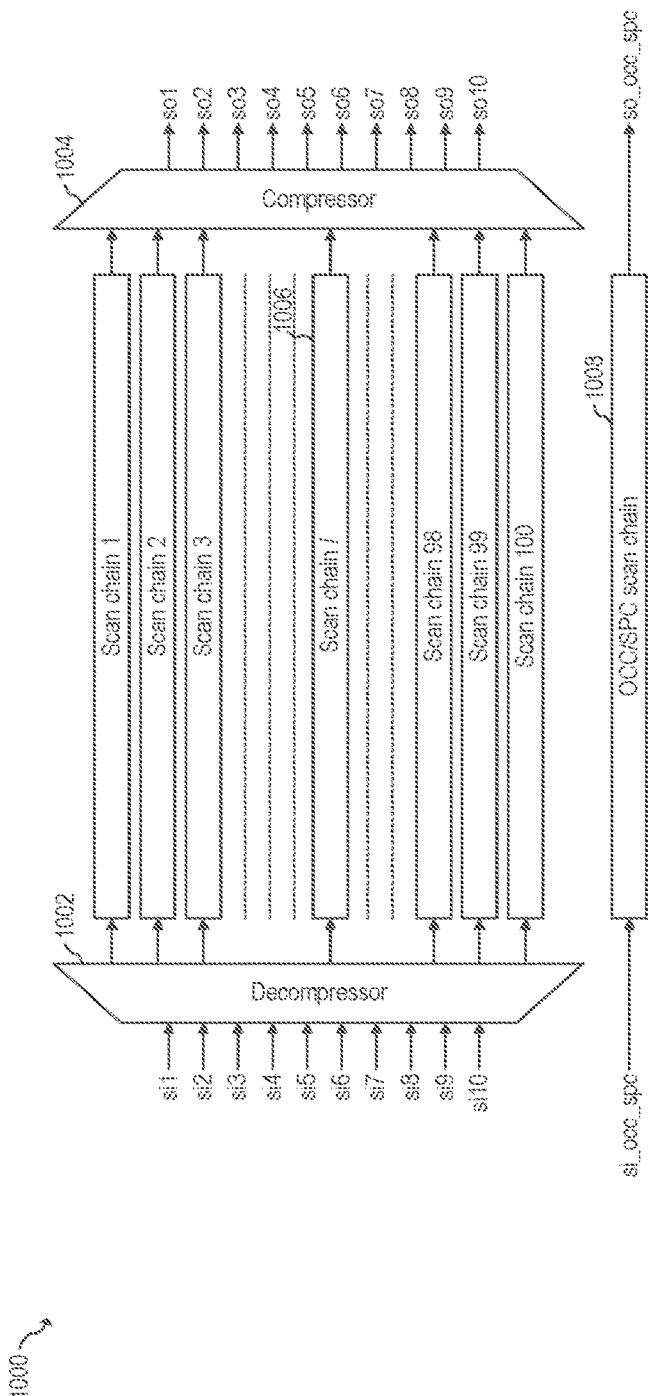

In some embodiments, test patterns run through scan chain 652 are not decompressed/compressed. For example, FIG. 10 shows a portion of scan circuit moo, according to an embodiment of the present invention. Scan circuit moo includes decompressor 1002, compressor 1004, a plurality of scan chains coupled between decompressor 1002, and compressor 1004, and scan chain 1008, which is not dependent on compression.

Although scan circuit woo is illustrated in FIG. 10 as having 10 inputs coupled to decompressor 1002 (si1 to si10), 10 outputs coupled to compressor 1004 (so1 to so10) and 100 scan chains coupled between decompressor 1002 and compressor 1004, it is understood that a different number of scan inputs coupled to decompressor 1002 (e.g., 9, 8, or lower, or 11, 15, 20, or higher), a different number of scan outputs (e.g., 9, 8, or lower, or 11, 15, 20, or higher) and/or a different number of scan chains coupled between decompressor 1002 and compressor 1004 (e.g., 99, 90, 50 or lower, or 101, 110, 1000, or higher) may also be used.

During scan, the decompressor 1002 receives at their inputs (e.g., si1 to si10) compressed test patterns from, e.g., LBIST controller 622 or from the ATE. The inputs coupled to decompressor 1002 (e.g., si1 to si10) are decompressed in a known manner and converted into a plurality of outputs coupled to the plurality of scan chains (e.g., scan chain 1 to scan chain 100). Data outputted by the plurality of scan chains (e.g., scan chain 1 to scan chain 100) are compressed in a known manner and converter into compressed outputs (e.g., so1 to so10). The compressed outputs are transmitted, e.g., to LBIST controller 622 or the ATE, and evaluated in a known manner to detect faults in the logic circuits coupled to the plurality of scan chains (e.g., scan chain 1 to scan chain 100). By using decompressor 1002 and compressor 1004, some embodiments advantageously run test patterns across N scan chains using less than N inputs and outputs (e.g., 10 times less inputs and outputs, or less).

In some embodiments, one or more scan chains of the plurality of scan chains (e.g., scan chain 1 to scan chain 100) may be implemented as scan chain 402, 502, 602, 802, or and/or 902. For example, in the embodiment of FIG. 10, scan chain i (also referred to as scan chain 1006) may be implemented as 402, 502, 602, 802, or 902, where i is an integer greater or equal to 1 and lower or equal to 100.

In some embodiments, at least one scan chain is not coupled between the decompressor and the compressor. For example, as shown in FIG. 10, in scan circuit moo, scan chain 1008 is not coupled between decompressor 1002 and compressor 1004 and, e.g., is not dependent on compression. For example, in some embodiments, scan chain 1008 may be used, e.g., for on-chip clocking (OCC), power control, shift power control (SPC), etc.

In some embodiments, scan chain 1008 is implemented as scan chain 652 and includes scan flip-flop 654. For example, in some embodiments, scan chain 1006 is implemented as scan chain 602 and scan chain 1008 is implemented as scan chain 652, so that scan chains 1006 and 1008 operate in a similar manner as described with respect to FIG. 6A. As another example, in some embodiments, scan chain 1006 is implemented as scan chain 802 and scan chain 1008 is implemented as scan chain 652, so that scan chains 1006 and 1008 operate in a similar manner as described with respect to FIG. 8. Other implementations are also possible.

In some embodiments, the same scan enable signal scan_en is applied to all scan chains of circuit 800. For example, in some embodiments, the same scan enable signal scan_en is applied to scan chains 1 to 100 and to scan chain 1008. In some embodiments, the scan enable signal scan_en may be generated by (e.g., a single) circuit 613.

As shown, e.g., in FIGS. 6 and 7, some embodiments advantageously allow for selecting (statically or dynamically) which scan flip-flop to use inside a scan chain, where the selected scan flip-flop is capable of providing observability and controllability (e.g., in LOC mode), and the non-selected scan flip-flop is capable of providing controllability in a mode similar to pipeline LOS mode without having an SE input transition in launch and also in capture clk pulse. As shown, e.g., in FIG. 8, some embodiments advantageously allow for selecting (statically or dynamically) which sub-scan chain to use inside a scan chain, where the selected sub-scan chain is capable of providing observability and controllability (e.g., in LOC mode), and the non-selected sub-scan chain is capable of providing controllability in a mode similar to pipeline LOS mode without having an SE input transition in launch and also in capture clk pulse.

Figure 11:
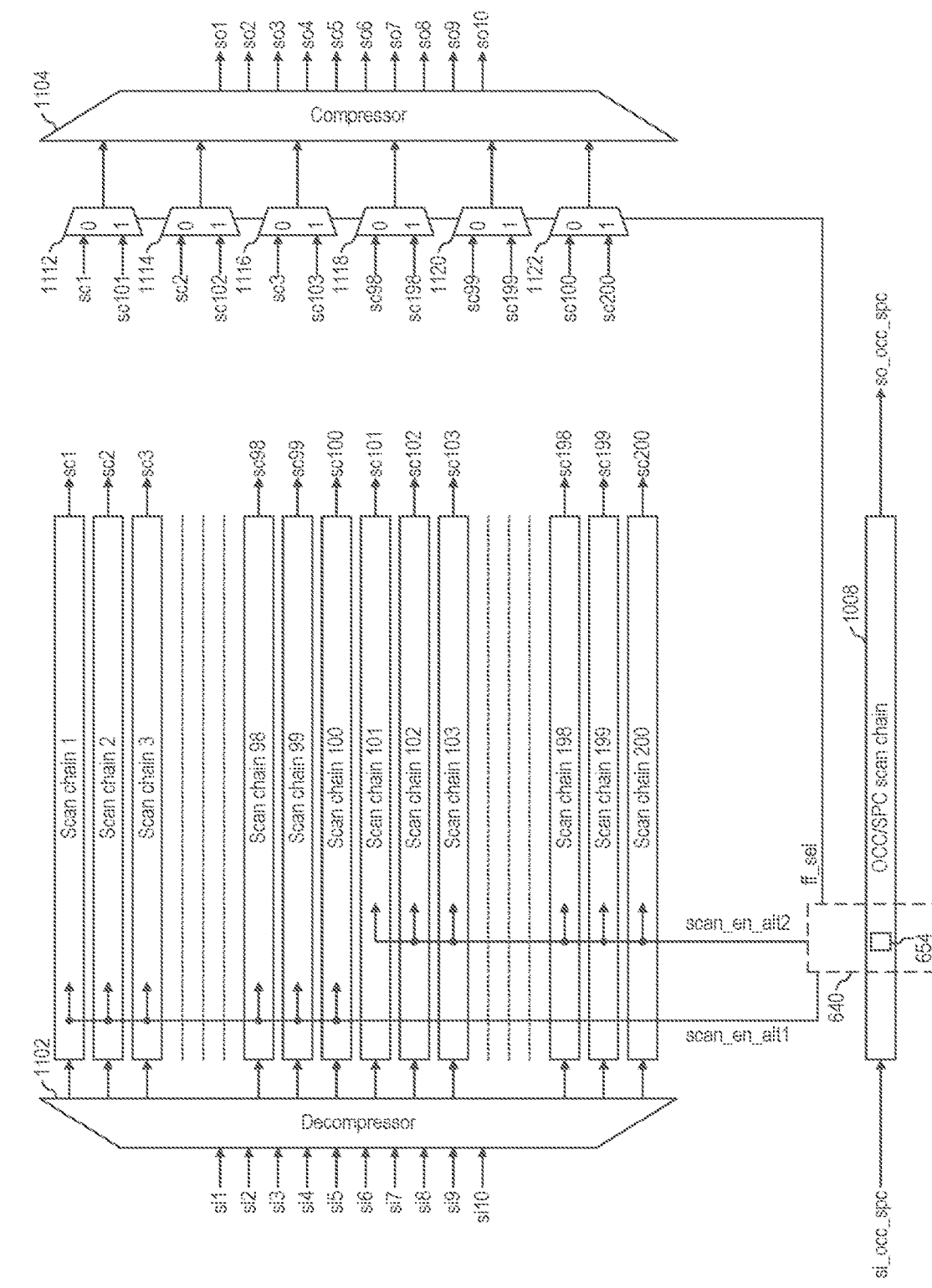

In some embodiments, the size of the sub-scan chain may be the same as the scan chain. In other words, in some embodiments, a scan chain may be selectable from among two scan chains so that the selected scan chain provides controllability and observability (e.g., in LOC mode) while the non-selected scan chain provides controllability in a mode similar to pipeline LOS mode without having an SE input transition in launch and also in capture clk pulse. For example, FIG. 11 shows a portion of scan circuit 1100, according to an embodiment of the present invention. Scan circuit 1100 includes decompressor 1102, compressor 1104, a plurality of scan chains coupled between decompressor 1102 and compressor 1104, and scan chain 1008, which is not dependent on compression.

As shown in FIG. 11, scan circuit 1100 is capable of dynamically selecting a first set of scan chains (scan chains 1 to 100) or a second set of scan chains (scan chains 101 to 200) for providing observability and controllability to logic circuits coupled to the scan chains of the selected set of scan chains while the non-selected set of scan chains provides controllability to logic circuits coupled to the scan chains of the non-selected set of scan chains.

As shown in FIG. 11, signals ff_sel, scan_en_alt1 and scan_en_alt2 may be generated by circuit 640. Signal ff_sel is applied to all MUXes 1112, 1114, 1116, 1118, 1120, and 1122. Signal scan_en_alt1 is applied to the SE input of all scan flip-flops of scan chains 1 to 100. Signal scan_en_alt2 is applied to the SE input of all scan flip-flops of scan chains 101 to 200.

MUXes 1112, 1114, 1116, 1118, 1120, and 1122 are configured to select between the first set of scan chains (scan chains 1 to 100) and the second set of scan chains (scan chains 101 to 200) based on signal ff_sel.

In some embodiments, when ff_sel is low, scan chains 1 to 100 provide observability to logic circuits having outputs coupled to the scan flip-flops of scan chains 1 to 100 and controllability to the logic circuits having inputs coupled to scan flip-flops of scan chains 1 to 100 (e.g., in LOC mode), and scan chains 101 to 200 provide controllability to the logic circuits having inputs coupled to the scan flip-flops of scan chains 101 to 200 in a mode similar to pipeline LOS mode without having an SE input transition in launch and also in capture clk pulse. When ff_sel is high, scan chains 101 to 200 provide observability to logic circuits having outputs coupled to the scan flip-flops of scan chains 101 to 200 and controllability to the logic circuits having inputs coupled to scan flip-flops of scan chains 101 to 200 (e.g., in LOC mode), and scan chains 1 to 100 provide controllability to the logic circuits having inputs coupled to the scan flip-flops of scan chains 1 to 100 in a mode similar to pipeline LOS mode without having an SE input transition in launch and also in capture clk pulse.

In some embodiments, logic circuits controllable by scan chains 101 to 200 have outputs coupled to scan flip-flops of scan chains 1 to 100 so that they are observable when signal ff_sel is low. In some embodiments, logic circuits controllable by scan chains 1 to 100 have outputs coupled to scan flip-flops of scan chains 101 to 200 so that they are observable when signal ff_sel is high.

As shown in FIG. 11, some embodiments may be implemented with decompressor 1102 independently driving each of scan chains 1 to 200. In other embodiments, decompressor 1102 may provide the same inputs to scan chains i and i+100 (e.g., scan chains 1 and 101 are driven by the same input, etc.) By independently driving each of scan chains 1 to 200, some embodiments advantageously achieve higher coverage and/or lower test time when compared with embodiments having scan chains i and 100+i sharing the same input.

Advantages of some embodiments include reducing test time of scan without compromising scan coverage and without designing the scan enable signal to satisfy fast transition times of LOS mode and pipeline LOS mode. For example, a conventional CODEC with LOC architecture and internal scan chains having a length of 100 (100 scan flip-flops), 10,000 test patterns and clock period of 40 ns may result in a test time of 4,040,400 ns (since ((10000*100)+10000+100)*40=40404000 ns). If an embodiment decompression/compression architecture, e.g., as illustrated in FIG. 11, is used, then scan chains with half the length (e.g., 50) may be used. For such architecture, similar coverage may be achieved with about 19,000 test patterns, which at a clock period of 40 ns results in a test time of 38,762,000 ns (since ((19000*50)+19000+50)*40=38762000 ns). Thus, the test time saved may be about 1,642,000 ns or over 4%.

Figure 12:
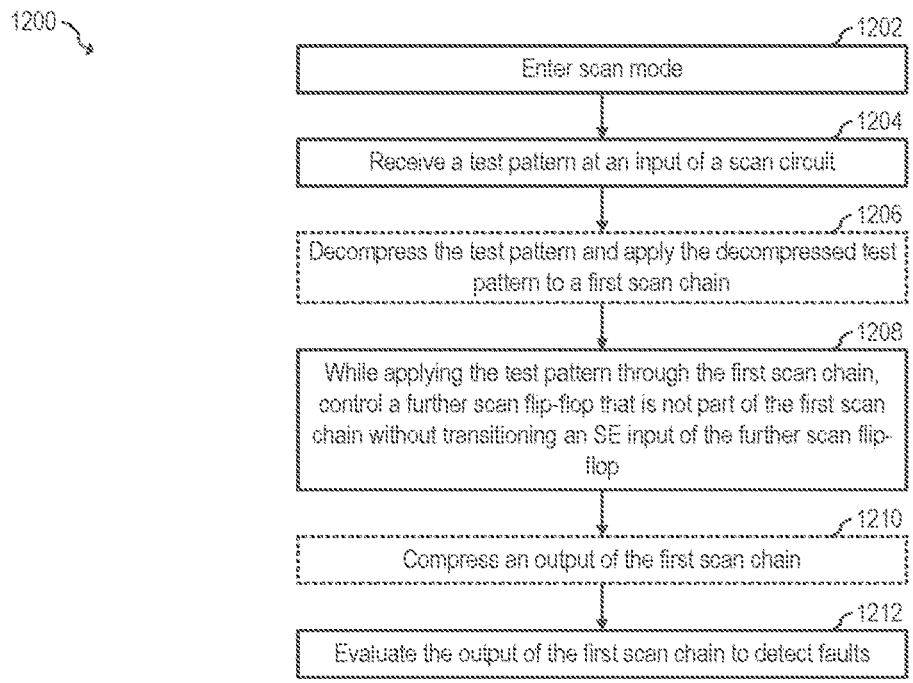
FIGS. 12 and 13 show flow charts of embodiment methods for performing scan, according to embodiments of the present invention.

FIG. 12 shows a flow chart of embodiment method 1200 for performing scan, according to an embodiment of the present invention. Method 1200 may be implemented, e.g., by scan circuits 400, 500, 600, 700, 800, 900, 1000, or 1100.

During step 1202, an IC that includes a scan circuit (e.g., 400, 500, 600, 700, 800, 900, 1000, 1100) enters scan mode. In some embodiments, entering scan mode comprises asserting (e.g., high) a scan mode signal (e.g., scan mode). In some embodiments, entering LBIST mode (e.g., LBIST_mode set to high) or entering ATPG mode (e.g., ATPG_mode set to high) causes the scan mode signal to be asserted.

In some embodiments, the scan circuit is capable of entering LBIST mode or ATPG mode, but not both. In some embodiments, the scan circuit is capable of entering LBIST mode and ATPG mode.

During step 1204, the scan circuit receives a test pattern. For example, in some embodiments, the scan circuit receives a test pattern directly from the ATPG or LBIST controller into an input of a first scan chain (e.g., at an SI input of a first scan flip-flop of the first scan chain, where the first scan chain may be, e.g., scan chain 402, 502, 602, or 802). In some embodiments, the test pattern is received at an input of a decompressor (e.g., 1002, 1102) that has an output coupled to the first scan flip-flop of the first scan chain.

During step 1206, the received pattern is decompressed in a known manner by the decompressor and applied to the first scan chain. In embodiments in which the first scan chain is not dependent on compression, step 1206 may be omitted.

During step 1208, while the test pattern is applied to the first scan chain (e.g., in LOC mode), a further scan flip-flop (e.g., 452) is controlled with an output of a scan flip-flop of the first scan chain (e.g., 408) without transitioning the SE input of the further scan flip-flop (e.g., in a mode similar to pipeline LOS mode without having an SE input transition in launch and also in capture clk pulse), e.g., to control a further logic circuit (e.g., 472) with the further scan flip-flop. In some embodiments, an output of the further logic circuit is coupled to a scan flip-flop of the first scan chain. In some embodiments, the output of the further logic circuit is coupled to a scan flip-flop of another scan chain different from the first scan chain.

During step 1210, an output of the first scan chain is compressed by a compressor (e.g., 1004, 1104) an outputted for evaluation. In embodiments in which the first scan chain is not dependent on compression, step 1210 may be omitted.

During step 1212, the output of the first scan chain is evaluated in a known manner for detecting faults (e.g., stuck-at faults, timing faults, etc.) in logic circuits having outputs coupled to the first scan chain.

As shown by FIG. 12, some embodiments advantageously provide controllability during scan mode by a first scan chain to a further scan flip-flop that is not inside the first scan chain.

Figure 13:
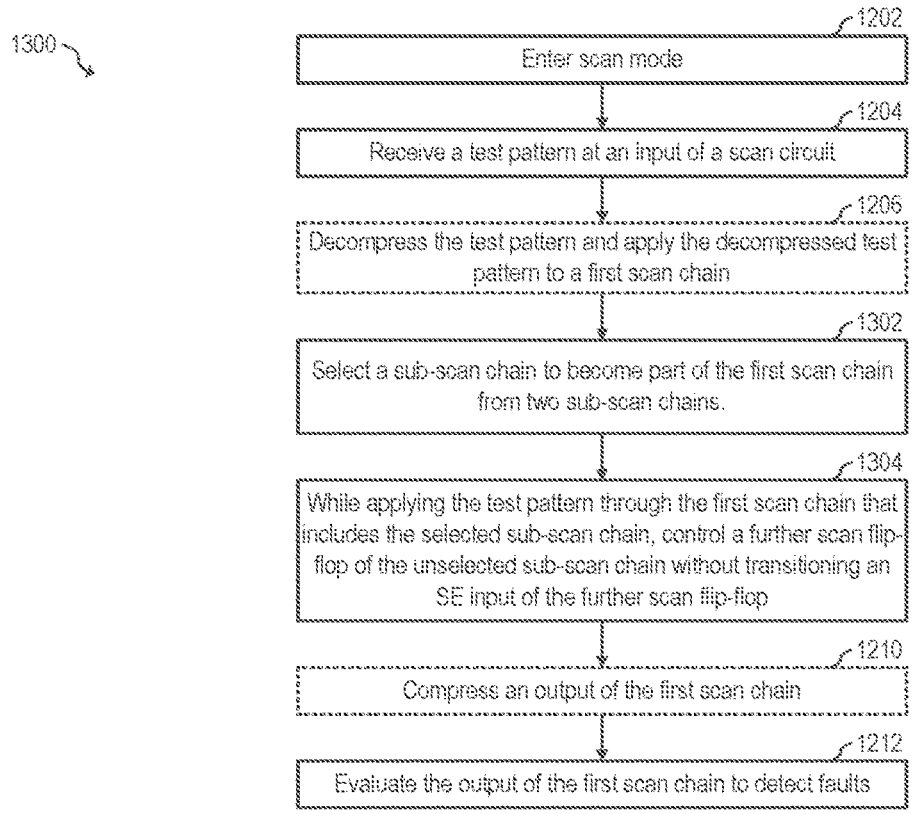

FIG. 13 shows a flow chart of embodiment method 1300 for performing scan, according to an embodiment of the present invention. Method 1300 may be implemented, e.g., by scan circuits 500, 600, 700, 800, 900, 1000, or 1100. Method 1300 includes steps 1202, 1204, 1206, 1302, 1304, 1210, and 1212. Steps 1202, 1204, 1206, 1210, and 1212 may be performed in a similar manner as in method 1200.

During step 1302, a sub-scan chain is selected to become part of the first scan chain from two sub-scan chains. In some embodiments, the selected sub-scan chain receives an input at an SI input of a first scan flip-flop of the selected sub-scan chain from a Q output of a scan flip-flop of the first scan chain and provides an output at a Q output of a last scan flip-flop of the selected sub-scan chain to an SI input of a scan flip-flop of the first scan chain. In some embodiments, the unselected sub-scan chain receives an input at an SI input of a first scan flip-flop of the unselected sub-scan chain from a Q output of a scan flip-flop of the first scan chain but the output at the Q output of a last scan flip-flop of the unselected sub-scan chain is not coupled to an SI input of a scan flip-flop of the first scan chain.

The length of the two sub-scan chains may be 1 or more. For example, in some embodiments (e.g., scan circuits 500, 600, and 700), the length of the two sub-scan chains may be a single scan flip-flop (e.g., scan flip-flop 452 being one sub-scan chain and scan flip-flop 408 being the other sub-scan chain). In other embodiments (e.g., scan circuit 800, and 1100), the two sub-scan chains may have more than one scan flip-flop such as two or more. For example, scan circuit 800 illustrates an embodiment having two sub-scan chains with two scan flip-flops each (one having scan flip-flops 406 and 408 and the other having scan flip-flops 852 and 452).

In some embodiments, the sub-scan chain is selected based on a state of a selection signal (e.g., ff_sel). In some embodiments, the state of the selection signal is based on a register bit (e.g., LBIST_FF_ctrl or ATPF_FF_ctrl). In some embodiments, the state of the selection signal is based on an output of a scan flip-flop (e.g., 654) of a scan chain.

During step 1304, while the test pattern is applied to the first scan chain (e.g., in LOC mode), a further scan flip-flop of the unselected sub-scan chain is controlled with an output of a scan flip-flop of the first scan chain without transitioning the SE input of the further scan flip-flop (e.g., in a mode similar to pipeline LOS mode without having an SE input transition in launch and also in capture clk pulse), e.g., to control a further logic circuit with the further scan flip-flop. In some embodiments, an output of the further logic circuit is coupled to a scan flip-flop of the first scan chain. In some embodiments, the output of the further logic circuit is coupled to a scan flip-flop of another scan chain different from the first scan chain.

Figure 14:
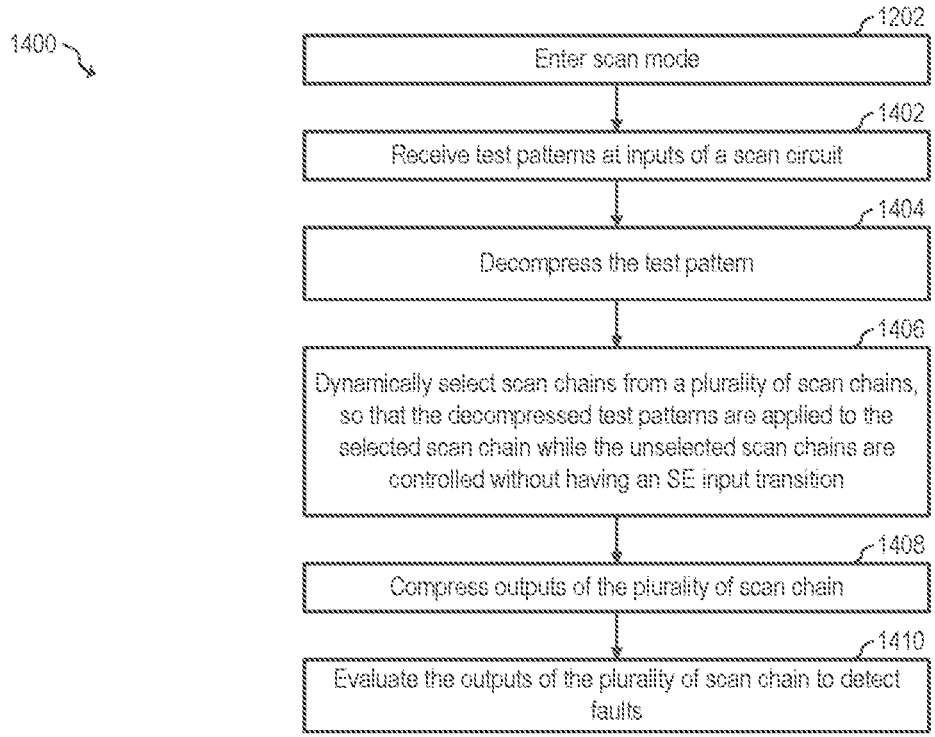
FIG. 14 shows a flow chart of an embodiment method for scan compression, according to an embodiment of the present invention.

FIG. 14 shows a flow chart of embodiment method 1400 for scan compression, according to an embodiment of the present invention. Method 1400 may be implemented, e.g., by scan circuits 1100. Method 1400 includes steps 1202, 1402, 1404, 1406, 1408, and 1410. Step 1202 may be performed in a similar manner as in method 1200.

During step 1402, test patterns are received at inputs (e.g., si1 to si10) of a scan circuit (e.g., 1100). During step 1404, the test patterns are decompressed by a decompressor (e.g., 1102) so that the test patterns are applied to plurality of scan chains.

During step 1406, scan chains from the plurality of scan chains (scan chain 1 to scan chain 200) are dynamically selected (e.g., selecting either scan chains 1 to 100 or 101 to 200) so that test patterns are applied to the selected scan chain, e.g., in LOC mode while the unselected scan chains are controlled in a mode similar to pipeline LOS mode without having an SE input transition in launch and also in capture clk pulse. In some embodiments, a selection signal (e.g., ff_sel) is used to select between first (e.g., scan chain 1 to scan chain 100) and second (e.g., scan chain 101 to scan chain 200) sets of scan chains. In some embodiments, the selection signal is controlled by an output of a scan flip-flop (e.g., 654) that, e.g., is in a scan chain (e.g., scan chain 1008) that is not dependent on compression.

During step 1408, the outputs of the plurality of scan chains are compressed so that they are evaluated during step 1410 to detect faults.

Figure 15:
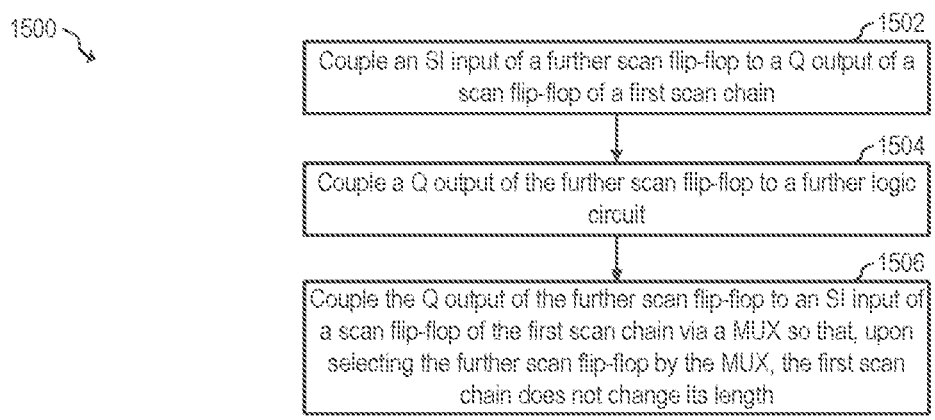
FIG. 15 shows a flow chart of an embodiment method for modifying a scan circuit to provide observability and/or controllability to logic circuits added or modified after scan insertion, according to an embodiment of the present invention.

Some embodiments advantageously allow for providing observability and/or controllability to logic circuits added after scan insertion without affecting the length of the original scan chains. For example, FIG. 15 shows a flow chart of embodiment method 1500 for modifying a scan circuit to provide observability and/or controllability to logic circuits added or modified after scan insertion, according to an embodiment of the present invention.

During step 1502, an SI input of a further scan flip-flop is coupled to a Q output of a scan flip-flop of a first scan chain. For example, as shown in FIGS. 5, 6A, and 7, in some embodiments, an SI input of a further scan flip-flop (e.g., 452) is coupled to a Q output of a scan flip-flop (e.g., 406) of a first scan chain (e.g., 502, 602). In some embodiments, e.g., as shown in FIG. 4, and SI input of further scan flip-flop (e.g., 452) is coupled to a Q output of a scan flip-flop (e.g., 408) of a first scan chain (e.g., 402). In some embodiments, the further scan flip-flop may be added after scan insertion. In other embodiments, the further scan flip-flop is not added after scan insertion. For example, in some embodiments, the further scan flip-flop may be a dummy scan flip-flop already implemented, e.g., in one of the scan chains of the IC.

During step 1504, the Q output of the further scan flip-flop is coupled to a further logic circuit (e.g., 472). In some embodiments, performing steps 1502 and 1504 provides controllability to the further scan flip-flop in a mode similar to pipeline LOS mode without having an SE input transition in launch and also in capture clk pulse so that the further logic circuit is stimulated while the first scan chain runs test patterns.

During step 1506, the Q output of the further scan flip-flop is further coupled to an SI input of another scan flip-flop (e.g., 410), e.g., via a MUX (e.g., 504). Upon selecting the further scan flip-flop by the MUX, the first scan chain does not change its length, e.g., since the further scan flip-flop replaces an original scan flip-flop (e.g., 408) upon selection.

In some embodiments, the selection signal (e.g., ff_sel) for controlling the MUX is based on a scan flip-flop (e.g., 654) of a scan chain (e.g., 652). In some embodiments, the scan flip-flop (e.g., 654) is implemented as a dummy scan flip-flop before scan insertion, e.g., in anticipation of using such flip-flop for controlling the selection signal.

In some embodiments, all or some of the additional logic for performing steps 1502, 1504, and/or 1506 (e.g., circuits 432, 504, 506, 508, 510, 606, 608, 610, 613, 614, 616, 618, 620, 624, 626, and/or 904) may be added after scan insertion. In some embodiments, all or some of the additional logic for performing steps 1502, 1504, and/or 1506 may be implemented before scan insertion and the coupling modified after scan insertion.

In some embodiments, step 1506 may be omitted.

Advantages of some embodiments include providing static or dynamic selection of scan flip-flops to be included in a scan chain while non-selected scan flip-flops provide additional controllability with mode similar to pipeline LOS architecture but with SE input remaining high throughout capture.

Example embodiments of the present invention are summarized here. Other embodiments can also be understood from the entirety of the specification and the claims filed herein.

Example 1. A method for performing scan, the method including: entering scan mode; receiving a test pattern; applying the test pattern through a first scan chain by asserting and deasserting a scan enable signal to respectively perform shift and capture operations to the first scan chain; while applying the test pattern through the first scan chain, controlling a further scan flip-flop with the first scan chain without transitioning a further scan enable input of the further scan flip-flop; and evaluating an output of the first scan chain to detect faults.

Example 2. The method of example 1, where the further scan enable input is kept high while applying the test pattern through the first scan chain.

Example 3. The method of one of examples 1 or 2, further including decompressing a compressed input test pattern to generate the test pattern.

Example 4. The method of one of examples 1 to 3, where controlling the further scan flip-flop with the first scan chain includes controlling the further scan flip-flop with an output of a first given scan flip-flop of the first scan chain, the output of the first given scan flip-flop further coupled to an SI input of a second given scan flip-flop of the first scan chain, the method further including: generating a selection signal; and selectively connecting the output of the second given scan flip-flop or an output of the further scan flip-flop with an input of a third given scan flip-flop of the first scan chain based on the selection signal.

Example 5. The method of one of examples 1 to 4, where generating the selection signal includes generating the selection signal based on a register bit.

Example 6. The method of one of examples 1 to 5, where generating the selection signal includes generating the selection signal based on a scan flip-flop of a further scan chain.

Example 7. The method of one of examples 1 to 6, where the first scan chain is dependent on compression and the further scan chain is not dependent on compression.

Example 8. The method of one of examples 1 to 7, where receiving the test pattern includes receiving the test pattern from an LBIST controller.

Example 9. The method of one of examples 1 to 8, where receiving the test pattern includes receiving the test pattern from an automated test equipment (ATE).

Example 10. The method of one of examples 1 to 9, where entering scan mode includes asserted a scan mode signal.

Example 11. An integrated circuit including: a plurality of logic circuits; and a scan circuit, where the integrated circuit is configured to: enter scan mode; receive a test pattern; apply the test pattern through a first scan chain of the scan circuit by asserting and deasserting a scan enable signal to respectively perform shift and capture operations to the first scan chain; and while applying the test pattern through the first scan chain, controlling a further scan flip-flop of the scan circuit with the first scan chain without transitioning a further scan enable input of the further scan flip-flop.

Example 12. The integrated circuit of example ii, further including an LBIST controller configured to provide the test pattern.

Example 13. The integrated circuit of one of examples 11 or 12, further including an OR gate having an output coupled the further scan enable input of the further scan flip-flop, the output of the OR gate being indicative of whether the integrated circuit is in scan mode.

Example 14. The integrated circuit of one of examples 11 to 13, where the scan circuit further includes a multiplexer (MUX) having a first input coupled to an output of a scan flip-flop of the first scan chain, a second input coupled to an output of the further scan flip-flop, and an output coupled to the first scan chain.

Example 15. The integrated circuit of one of examples 11 to 14, further including a second further scan flip-flop having an output coupled to a selection input of the MUX.

Example 16. The integrated circuit of one of examples 11 to 15, where the second further scan flip-flop is part of a second scan chain different form the first scan chain.

Example 17. The integrated circuit of one of examples 11 to 16, further including a third further scan flip-flop having a clock input coupled to a scan enable input of the second further scan flip-flop, and an output coupled to the selection input of the MUX.

Example 18. The integrated circuit of one of examples 11 to 17, further including a latch coupled between the second further scan flip-flop and the selection input of the MUX.

Example 19. A method for performing scan, the method including: entering scan mode; receiving a test pattern; selecting a sub-scan chain to become part of a first scan chain; applying the test pattern through the first scan chain by asserting and deasserting a scan enable signal to respectively perform shift and capture operations to the first scan chain; while applying the test pattern through the first scan chain, controlling an unselected sub-scan chain with the first scan chain without transitioning a scan enable input of a scan flip-flop of the unselected sub-scan chain, where the selected sub-scan chain has a length of N, the unselected sub-scan chain has a length of N, and N is a positive integer greater than or equal to 1; and evaluating an output of the first scan chain to detect faults.

Example 20. The method of example 19, where the first scan chain has a length of N.

Example 21. A method including: entering scan mode; receiving test patterns; decompressing the test patterns; dynamically selecting scan chains from a plurality of scan chains; applying the decompressed test patterns to the selected scan chains by pulsing a clock signal and transitioning a scan enable signal coupled to the selected scan chains; and applying the decompressed test patterns to unselected scan chains without transitioning a scan enable signal coupled to the unselected scan chains; compressing outputs of the plurality of scan chains; and evaluating the compressed outputs to detect faults.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An integrated circuit (IC) comprising:
a plurality of logic circuits (ICs); and
a scan circuit, wherein the integrated circuit (IC) is configured to:
enter scan mode of the IC,
receive a test pattern,
select a sub-scan chain to become part of a first scan chain,
apply the test pattern through the first scan chain by asserting and deasserting a scan enable signal to respectively perform shift and capture operations to the first scan chain,
while applying the test pattern through the first scan chain, control an unselected sub-scan chain with the first scan chain without transitioning a scan enable input of a scan flip-flop of the unselected sub-scan chain, wherein the selected sub-scan chain has a length of N, the unselected sub-scan chain has a length of N, and N is a positive integer greater than or equal to 1, and evaluate an output of the first scan chain to detect faults of the IC.

2. The integrated circuit of claim 1, wherein the first scan chain has a length of N.

3. The integrated circuit of claim 1, further comprising an logic built-in-self-test (LBIST) controller configured to provide the test pattern.

4. The integrated circuit of claim 1, further comprising an OR gate having an output coupled the further scan enable input of the further scan flip-flop, the output of the OR gate being indicative of whether the integrated circuit is in scan mode.

5. The integrated circuit of claim 1, wherein the scan circuit further comprises a multiplexer (MUX) having a first input coupled to an output of a scan flip-flop of the first scan chain, a second input coupled to an output of the further scan flip-flop, and an output coupled to the first scan chain.

6. The integrated circuit of claim 5, further comprising a second further scan flip-flop having an output coupled to a selection input of the MUX.

7. The integrated circuit of claim 6, wherein the second further scan flip-flop is part of a second scan chain different form the first scan chain.

8. The integrated circuit of claim 6, further comprising a third further scan flip-flop having a clock input coupled to a scan enable input of the second further scan flip-flop, and an output coupled to the selection input of the MUX.

9. The integrated circuit of claim 6, further comprising a latch coupled between the second further scan flip-flop and the selection input of the MUX.

10. An integrated circuit (IC) comprising:
a plurality of logic circuits (ICs); and
a scan circuit, wherein the integrated circuit (IC) is configured to:
enter scan mode of an integrated circuit (IC),
receive test patterns,
decompress the test patterns,
dynamically select scan chains from a plurality of scan chains,
apply the decompressed test patterns to the selected scan chains by pulsing a clock signal and transitioning a scan enable signal coupled to the selected scan chains,
apply the decompressed test patterns to unselected scan chains without transitioning a scan enable signal coupled to the unselected scan chains,
compress outputs of the plurality of scan chains, and
evaluate the compressed outputs to detect faults of the IC.

11. The integrated circuit of claim 10, further comprising an logic built-in-self-test (LBIST) controller configured to provide the test pattern.

12. The integrated circuit of claim 10, further comprising an OR gate having an output coupled the further scan enable input of the further scan flip-flop, the output of the OR gate being indicative of whether the integrated circuit is in scan mode.

13. The integrated circuit of claim 10, wherein the scan circuit further comprises a multiplexer (MUX) having a first input coupled to an output of a scan flip-flop of a first scan chain of the plurality of scan chains, a second input coupled to an output of the further scan flip-flop, and an output coupled to the first scan chain.

14. The integrated circuit of claim 13, further comprising a second further scan flip-flop having an output coupled to a selection input of the MUX.

15. The integrated circuit of claim 14, wherein the second further scan flip-flop is part of a second scan chain different form the first scan chain.

16. The integrated circuit of claim 14, further comprising a third further scan flip-flop having a clock input coupled to a scan enable input of the second further scan flip-flop, and an output coupled to the selection input of the MUX.

17. The integrated circuit of claim 14, further comprising a latch coupled between the second further scan flip-flop and the selection input of the MUX.

18. A method for detecting faults in an integrated circuit (IC), the method comprising:
coupling a Q output of a first scan flip-flop of a first scan chain to an SI input of second scan flip-flop, the Q output of the first scan flip-flop being a primary data output terminal of the first scan flip-flop, the SI input of the second scan flip-flop being a scan data input terminal of the second scan flip-flop that receives data during scan operations when a scan enable signal is asserted, the first scan chain having a first length upon coupling the Q output of the first scan flip-flop to the SI input of the second scan flip-flop and coupled to a first logic circuit;
coupling a Q output of the second scan flip-flop to a second logic circuit, the Q output of the second scan flip-flop being a primary data output terminal of the second scan flip-flop; and
coupling the Q output of the second scan flip-flop to an SI input of a third scan flip-flop of the first scan chain via a multiplexer, the SI input of the third scan flip-flop being a scan data input terminal of the third scan flip-flop that receives data during scan operations when a scan enable signal is asserted, wherein a length of the first scan chain is the first length upon selecting the second scan flip-flop by the multiplexer.

19. The method of claim 18, wherein the second scan flip-flop is coupled to the first and the third scan flip-flops after a scan insertion, the scan insertion comprising performing an initial scan circuit implementation and timing closure on the integrated circuit.

20. The method of claim 18, wherein the second scan enable input of the second scan flip-flop is kept asserted while applying a test pattern through the first scan chain.

* * * * *